United States Patent
Matsuo et al.

(10) Patent No.: US 10,718,722 B2
(45) Date of Patent: Jul. 21, 2020

(54) METHOD OF INSPECTING BACK SURFACE OF EPITAXIAL WAFER, EPITAXIAL WAFER BACK SURFACE INSPECTION APPARATUS, METHOD OF MANAGING LIFT PIN OF EPITAXIAL GROWTH APPARATUS, AND METHOD OF PRODUCING EPITAXIAL WAFER

(71) Applicant: SUMCO CORPORATION, Tokyo (JP)

(72) Inventors: Keiko Matsuo, Tokyo (JP); Naoyuki Wada, Tokyo (JP); Masahiko Egashira, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/491,274

(22) PCT Filed: Feb. 22, 2018

(86) PCT No.: PCT/JP2018/006517
§ 371 (c)(1),
(2) Date: Sep. 5, 2019

(87) PCT Pub. No.: WO2018/163850
PCT Pub. Date: Sep. 13, 2018

(65) Prior Publication Data
US 2020/0072762 A1 Mar. 5, 2020

(30) Foreign Application Priority Data

Mar. 8, 2017 (JP) .................................. 2017-043892

(51) Int. Cl.
*G01N 21/95* (2006.01)
*G01N 21/956* (2006.01)
(Continued)

(52) U.S. Cl.
CPC ... *G01N 21/9501* (2013.01); *G01N 21/95607* (2013.01); *G06T 5/50* (2013.01);
(Continued)

(58) Field of Classification Search
None
See application file for complete search history.

(56) References Cited

U.S. PATENT DOCUMENTS

| | | |
|---|---|---|
| 9,355,440 B1 | 5/2016 | Chen et al. |
| 2004/0021097 A1* | 2/2004 | Preece ................... G01N 21/21 250/559.4 |

(Continued)

FOREIGN PATENT DOCUMENTS

| | | |
|---|---|---|
| JP | 2007-292641 A | 11/2007 |
| JP | 2010-103275 A | 5/2010 |

(Continued)

OTHER PUBLICATIONS

International Search Report issued in International Patent Application No. PCT/JP2018/006517, dated Mar. 27, 2018.
(Continued)

*Primary Examiner* — Michelle M Iacoletti
(74) *Attorney, Agent, or Firm* — Greenblum & Bernstein, P.L.C.

(57) ABSTRACT

Provided is a method of inspecting the back surface of an epitaxial wafer, capable of detecting pin mark defects in the back surface of the epitaxial wafer and quantitatively evaluating the defect size of individual point defects of the pin mark defects. The method of inspecting the back surface of an epitaxial wafer includes an imaging step of consecutively taking partial images of the back surface while moving the optical system using the scanning unit; an acquisition step of acquiring a full image of the back surface from the partial images; a detection step of detecting, in the full image, pin
(Continued)

mark defects constituted by a set of a plurality of point defects present in the back surface of the silicon wafer 1; and a digitalization step of digitalizing the individual point defects to calculate the defect area of the individual point defects of the detected pin mark defects.

14 Claims, 13 Drawing Sheets

(51) Int. Cl.
    *G06T 5/50* (2006.01)
    *H01L 21/687* (2006.01)
    *G06T 7/00* (2017.01)

(52) U.S. Cl.
    CPC ............ *G06T 7/001* (2013.01); *G06T 7/0008* (2013.01); *H01L 21/68742* (2013.01); *G06T 2207/20221* (2013.01); *G06T 2207/30148* (2013.01)

(56) References Cited

U.S. PATENT DOCUMENTS

| | | | |
|---|---|---|---|
| 2010/0188486 A1* | 7/2010 | Amanullah | G06T 7/001 348/48 |
| 2013/0271596 A1 | 10/2013 | Lewis et al. | |
| 2018/0328859 A1* | 11/2018 | Osada | G01N 21/57 |

FOREIGN PATENT DOCUMENTS

| | | |
|---|---|---|
| JP | 2010-127897 A | 6/2010 |
| JP | 2015-513111 A | 4/2015 |
| JP | 2017-43525 A | 3/2017 |
| JP | 2017-72403 A | 4/2017 |

OTHER PUBLICATIONS

International Preliminary Report on Patentability for International Patent Application No. PCT/JP2018/006517, report dated Sep. 10, 2019, including Written Opinion.

* cited by examiner

◯ Measurement region (Total area)

◯ Measurement region (Area of individual points)

METHOD OF INSPECTING BACK SURFACE OF EPITAXIAL WAFER, EPITAXIAL WAFER BACK SURFACE INSPECTION APPARATUS, METHOD OF MANAGING LIFT PIN OF EPITAXIAL GROWTH APPARATUS, AND METHOD OF PRODUCING EPITAXIAL WAFER

TECHNICAL FIELD

This disclosure relates to a method of inspecting the back surface of an epitaxial wafer, an epitaxial wafer back surface inspection apparatus, a method of managing lift pins of an epitaxial growth apparatus, and a method of producing an epitaxial wafer.

BACKGROUND

As substrates used in the production process for semiconductor devices, wafers made of a semiconductor such as silicon wafers are widely used. As for such a wafer, polished wafers (PWs) obtained by slicing a single crystal ingot and mirror polishing the slices, epitaxial wafers obtained by forming an epitaxial layer on the surface of a PW, etc. are known. For example, epitaxial wafers are used as device substrates of various semiconductor devices such as metal oxide semiconductor field-effect transistors (MOSFETs), dynamic random access memories (DRAMs), power transistors, and back-illuminated solid-state imaging devices. Note that while "epitaxial wafer surface", "front surface", or simply "surface" of an epitaxial wafer herein refers to one side of the main surfaces of an epitaxial wafer, where an epitaxial layer is formed. Whereas, "epitaxial wafer back surface" or "back surface" of the epitaxial wafer refers to the other side of the main surfaces of the epitaxial wafer, opposite to the surface where the epitaxial layer is formed (i.e., surface where the epitaxial layer is not formed).

In terms of enhancing yield and reliability of a semiconductor device manufacturing processes, inspection techniques for detecting defects in the front and back surfaces of wafers used as substrates of semiconductor devices have increasingly become very important. Various defects are formed in the front and back surfaces of a wafer. Examples include crystal defects such as pits and COPs, unevenly polished portions and scratches formed due to machining, and adhesion of particles that are foreign materials.

Conventionally, using a particle inspection system, wafer inspection is performed in which wafer surfaces having been finished by mirror polishing are scanned with laser light thereby detecting scattered light from particles, scratches, and the like in the front and back surfaces. Further, in order to determine the presence and absence of defects that are hardly identified by a particle inspection system, appearance inspection is also performed in which the wafer surfaces are examined by visual observation. Since appearance inspection is an organoleptic test, variation in the identification depending on inspectors cannot be avoided, and it takes time for inspectors to master the examination technique. Therefore, there is a demand for establishing an objective inspection method and an automatic inspection method.

To address this, we have previously proposed, in JP 2010-103275 A (PTL 1), as a wafer inspection method, a method of properly evaluating wafers without appearance inspection especially focusing on defects on the rear surface side of the wafer surfaces. Specifically, the method is a method of evaluating the rear surface of a wafer, including: a mapping step of consecutively taking partial images of the rear surface of a wafer in the circumference direction of the wafer and composing the taken partial images to compose a full image of the rear surface of the wafer; and a differentiation step of differentiating the full image to create a differentiated image of the rear surface of the wafer, wherein the wafer is evaluated by detecting unevenly polished portions, haze, scratches, and particles based on the full image or the differentiated image.

An optical system 50 for creating the above full image is described with reference to FIGS. 1A and 1B. FIG. 1B depicts the major part of FIG. 1A for illustrating irradiation light $L_1$ emitted by an annular fiber optic illuminator 51 and reflected light (scattered light) $L_2$. This optical system 50 includes an annular fiber optic illuminator 51, a lens barrel 52, a telecentric lens 53, and a light receiving unit 54. An extra high pressure mercury lamp (wavelength range: 369 nm to 692 nm, output: over 1,000,000 lux) is used as a light source of the annular fiber optic illuminator 51, and a CCD camera is used as the light receiving unit 54. The irradiation light $L_1$ emitted by the annular fiber optic illuminator 51 enters a wafer W at an angle of approximately 20° with respect to the wafer plane and turns into the scattered light $L_2$ upon colliding with a defect D present in the rear surface of the wafer W. The light receiving unit 54 takes an image upon receiving perpendicular scattered light of the scattered light $L_2$, thereby obtaining and storing the image containing the information of the position of the optical system 50 and the luminance information of the scattered light.

CITATION LIST

Patent Literature

PTL 1: JP 2010-103275 A

SUMMARY

Technical Problem

The inventors considered applying the technique described in PTL 1 to the examination of the state of defects in the back surface of an epitaxial wafer. However, when applying the technique described in PTL 1, as is, to the inspection of the back surface of an epitaxial wafer, not substantially all the defects that must be identified by appearance inspection cannot be detected as in an example illustrated in FIG. 2. Note that in the example in FIG. 2, substantially the entire central area of the back surface of the epitaxial wafer except for the circumferential portion is misidentified as being defective.

The inventors of this disclosure first studied the cause for not being able to detect defects of the back surface of an epitaxial wafer using conventional techniques. Unlike the back surface of a PW, a source gas reaches the back surface of an epitaxial wafer when an epitaxial layer is formed. Accordingly, compared with a PW, the surface condition of the back surface of an epitaxial wafer is rough (i.e., the haze level of the back surface is bad) due to the haze caused by a source gas that has reached the back surface when an epitaxial layer is formed. When the surface condition is rough as described above, irregular reflection occurs because of excessively intensive output of the light source of the above optical system 50, exceeding the full well capacity of the CCDs. Specifically, the inventors first ascertained that the misidentification of defects is attributed to the overflow of brightness of the scattered light caused due to the rough surface. Accordingly, even when applied to the examination of the state of defects in the back surface of an epitaxial wafer, the technique described in PTL 1 is considered to overlook defects which can be identified by appearance examination.

When an image of the surfaces of a PW is acquired, since the surfaces of the PW are less rough than the back surface of an epitaxial wafer, an extra high pressure mercury lamp such as a Hg lamp or a metal halide lamp producing light of short wavelengths and high illuminance has been used as a light source of an annular fiber optic illuminator so as to detect even very superficial flaws. However, since the overflow occurs for the above reason when such an optical system is used, such an optical system cannot be used for the detection of defects in the back surface of an epitaxial wafer. On the other hand, if the luminance of the extra high pressure mercury lamp is reduced to prevent the overflow, which in turn makes the illuminance unstable during the inspection. This being the case, the inventors contemplated using a light source which has relatively low illuminance but can be used in a stable manner for a light source of an annular fiber optic illuminator and made it possible to inspect the back surface of an epitaxial wafer using an inspection apparatus without appearance inspection by visual observation.

As a type of defects typically formed on the back surface of an epitaxial wafer, defects referred to as "pin mark defects" are known. Here, pin mark defects are defects caused depending on the shape of lift pins of an epitaxial growth apparatus or the contact state between the lift pins and a wafer, which defects are a set of circular point defects made up of groups of minute flaws such as traces of wear or deposits that are formed in the circumferential part of the back surface of an epitaxial wafer, typical of a lift-pin type epitaxial growth apparatus. Although pin mark defects can be detected as individual defects using a conventional particle inspection system, the defects cannot be identified as pin mark defects that form a set of defects (i.e., the defects cannot be identified as being particles or pin mark defects). Accordingly, the presence or absence of pin mark defects has been determined by appearance inspection by visual observation. Note that since pin mark defects are small defects, it has been impossible to determine the defect size of each point defect by visual observation. Here, the mechanism of the formation of pin mark defects is described using a schematic view of a typical epitaxial growth apparatus depicted in FIG. 3.

A lift-pin type epitaxial growth apparatus 200 depicted in FIG. 3 has a susceptor 220, a susceptor support shaft 230, three lift pins 240A, 240B, 240C, and an elevation shaft 250. Since the three lift pins 240A, 240B, and 240C are symmetrically placed at regular angular intervals (i.e., 120°) with respect to the center of the susceptor support shaft 230 as the central axis. Accordingly, the lift pin 240B is not shown in FIG. 3.

As described above, pin mark defects are formed due to contact between the back surface of a silicon wafer S and the lift pins 240A, 240B, 240C. Therefore, in the case of a typical epitaxial growth apparatus as in FIG. 3, three point defects are formed at angular intervals of 120° about the center of the back surface of the epitaxial wafer, and the set of those point defects constitutes pin mark defects. Note that the inventors newly found that the defect size (the size in the in-plane direction and the height or depth in the thickness direction) of individual point defects of pin mark defects varies depending on the contact state between a wafer and lift pins.

Hitherto, pin mark defects have been assumed to be a type of defects that are negligible even if formed or defects that are inevitably formed in the back surface of an epitaxial wafer. Accordingly, the main purpose of detecting pin mark defects has been to determine the presence of the pin mark defects to be screened out of all defects including defects that must not be present in a product wafer.

However, since miniaturization is being advanced at present, even pin mark defects which have been allowed to be present in a product wafer would have a detrimental effect in the device formation process depending on the defect size of individual point defects of the pin mark defects. For example, FIG. 4 is a schematic view illustrating an epitaxial wafer 1 being subjected to a photolithography step which is a kind of step of a device formation process. FIG. 4 illustrates the epitaxial wafer 1 being placed on a stage 400 having pin chucks. Here, the epitaxial wafer 1 has the silicon wafer S serving as a substrate, and an epitaxial layer E formed on the silicon wafer S. Point defects with different sizes $D_1$, $D_2$ are formed as pin mark defects in the back surface of the epitaxial wafer 1. A contact between the point defect $D_1$ with a small defect size and the pin chuck of the stage 300 hardly causes a problem; on the other hand, when the point defect $D_2$ with a large defect size is brought into contact with the pin chuck, defocusing would occur in a lithography step.

Accordingly, in addition to detecting pin mark defects in the back surface of an epitaxial wafer, a technique capable of quantitatively evaluate the defect size of individual point defects of the pin mark defects is sought to be established.

It could therefore be helpful to provide a method of inspecting the back surface of an epitaxial wafer, which is capable of detecting pin mark defects in the back surface of the epitaxial wafer and quantitatively evaluating the defect size of individual point defects of the pin mark defects.

Solution to Problem

The inventors of this disclosure made extensive studies to address the above challenge, and thus made the following findings.

[1] A light source which has relatively low illuminance and can be used in a stable manner is used as a light source of an annular fiber optic illuminator in an epitaxial wafer back surface inspection apparatus, thus an image of the back surface of an epitaxial wafer can be acquired as illustrated in FIG. 5A. In FIG. 5A, other than pin mark defects, so-called "a scratch" having a circular arc shape is also observed. The scratch can be observed more clearly by performing image processing to be described below in the embodiment (FIG. 5B).

[2] Pin mark defects are caused by contact between the back surface of an epitaxial wafer and lift pins of an epitaxial growth apparatus. Accordingly, pin mark defects can be detected by performing a proper detection step based on the image of the back surface of an epitaxial wafer, acquired by [1] above.

[3] The inventors found that the size of the defect area of individual point defects of pin mark defects in the epitaxial wafer would have a great influence on the substrate quality when the epitaxial wafer is used in the device formation process. When the individual point defects of the pin mark defects detected by [2] above is digitalized to calculate the defect area, the pin mark defects can be quantitatively evaluated depending on the defect area.

This disclosure is based on the above findings and studies, and we propose the following features.

(1) A method of inspecting a back surface of an epitaxial wafer using an epitaxial wafer back surface inspection apparatus having an optical system which is placed vertically with respect to the back surface of the epitaxial wafer and includes an imaging unit and an annular fiber optic illuminator having either blue LEDs or red LEDs as a light source, and a scanning unit that moves the optical system in parallel with the back surface, comprising:

an imaging step of consecutively taking partial images of the back surface while moving the optical system using the scanning unit;

an acquisition step of acquiring a full image of the back surface from the partial images;

a detection step of detecting, in the full image, pin mark defects constituted by a set of a plurality of point defects present in the back surface; and a digitalization step of digitalizing the individual point defects of the detected pin mark defects to calculate a defect area of the individual point defects, wherein in the detection step, a point-like reference defect at a position at a certain distance from a center of the back surface of the epitaxial wafer is abstracted, the position of the reference defect is defined as a first reference position, defects in the vicinity of a plurality of second reference positions found by rotating the first reference position by a regular angular interval about the center the plurality of times are abstracted, and the set of the point-like defects in the vicinity of the first reference position and the plurality of the second reference positions are detected as the pin mark defects.

(2) The method of inspecting a back surface of an epitaxial wafer, according to (1) above, wherein the digitalization step comprises:

a first step of acquiring a luminance value of each pixel corresponding to the individual point defects of the pin mark defects in the fill image;

a second step of converting the luminance value of each pixel to binary based on a predetermined luminance threshold; and a third step of calculating the defect area of the individual point defects based on the binary data of each pixel.

(3) The method of inspecting a back surface of an epitaxial wafer, according to (1) or (2) above, further comprising an evaluation step of determining whether the individual point defects are acceptable based on comparison between the defect area of the individual point defects and the predetermined area threshold, after the digitalization step.

(4) An epitaxial wafer back surface inspection apparatus comprising:

an optical system which is placed vertically with respect to the back surface of the epitaxial wafer and includes an imaging unit and an annular fiber optic illuminator having either blue LEDs or red LEDs as a light source;

a scanning unit that moves the optical system in parallel with the back surface;

an analysis unit for analyzing an image of the back surface of the epitaxial wafer, acquired by the optical system; and a control unit for controlling the optical system, the scanning unit, and the analysis unit, wherein the optical system consecutively takes partial images of the back surface while being moved by the scanning unit using the control unit, the analysis unit acquires a full image of the back surface from the partial images using the control unit, detects, in the full image, pin mark defects constituted by a set of a plurality of point defects present in the back surface, and calculates the defect area of the individual point defects of the detected pin mark defects by digitalizing the individual point defects, and wherein when the analysis unit detects the pin mark defects, a point-like reference defect at a position at a certain distance from a center of the back surface of the epitaxial wafer is abstracted, the position of the reference defect is defined as a first reference position, defects in the vicinity of a plurality of second reference positions found by rotating the first reference position by a regular angular interval about the center the plurality of times are abstracted, and the set of the point-like defects in the vicinity of the first reference position and the plurality of the second reference positions are detected as the pin mark defects.

(5) The epitaxial wafer back surface inspection apparatus according to (4) above, wherein in the digitalization, the analysis unit acquires a luminance value of each pixel corresponding to the individual point defects of the pin mark defects in the full image using the control unit, converts the luminance value of each pixel to binary based on a predetermined luminance threshold, and calculates the defect area of the individual point defects based on the binary data of each pixel.

(6) The method of inspecting a back surface of an epitaxial wafer, according to (4) or (5) above, wherein the analysis unit further performs evaluation for determining whether the individual point defects are acceptable using the control unit based on comparison between the defect area of the individual point defects and the predetermined area threshold.

(7) A method of managing lift pins of an epitaxial growth apparatus, comprising determining a replacement period for the lift pins of an epitaxial growth apparatus based on the defect area of the individual point defects, calculated by the method of inspecting a back surface of an epitaxial wafer, according to any one of (1) to (3) above.

(8) A method of producing an epitaxial wafer, comprising:

an epitaxial layer formation step of forming an epitaxial layer on a surface of a silicon wafer to obtain an epitaxial wafer using a lift-pin type epitaxial growth apparatus; and a back surface inspection step of inspecting a back surface of the epitaxial wafer, wherein using an epitaxial wafer back surface inspection apparatus having an optical system which is placed vertically with respect to the back surface of the epitaxial wafer and includes an imaging unit and an annular fiber optic illuminator having either blue LEDs or red LEDs as a light source, and a scanning unit that moves the optical system in parallel with the back surface, the back surface inspection step comprises:

(a) an imaging step of consecutively taking partial images of the back surface while moving the optical system using the scanning unit;

(b) an acquisition step of acquiring a full image of the back surface from the partial images;

(c) a detection step of detecting, in the full image, pin mark defects constituted by a set of a plurality of point defects present in the back surface;

(d) a digitalization step of digitalizing the individual point defects of the detected pin mark defects to calculate a defect area of the individual point defects; and (e) an evaluation step of determining whether the individual point defects are acceptable based on comparison between the defect area of the individual point defects and the predetermined area threshold, after the digitalization step, wherein in the detection step (c), a point-like reference defect at a position at a certain distance from a center of the back surface of the epitaxial wafer is abstracted, the position of the reference defect is defined as a first reference position, defects in the vicinity of a plurality of second reference positions found by rotating the first reference position by a regular angular interval about the center the plurality of times are abstracted, and the set of the point-like defects in the vicinity of the first reference position and the plurality of the second reference positions are detected as the pin mark defects.

(9) The method of producing an epitaxial wafer, according to (8) above, wherein the digitalization step (d) comprises:

a first step of acquiring a luminance value of each pixel corresponding to the individual point defects of the pin mark defects in the full image;

a second step of converting the luminance value of each pixel to binary based on a predetermined luminance threshold;

a third step of calculating the defect area of the individual point defects based on the binary data of each pixel.

Advantageous Effect

This disclosure can provide a method of inspecting the back surface of an epitaxial wafer, which is capable of detecting pin mark defects in the back surface of the epitaxial wafer and quantitatively evaluating the pin mark defects.

DETAILED DESCRIPTION

Figure 6:
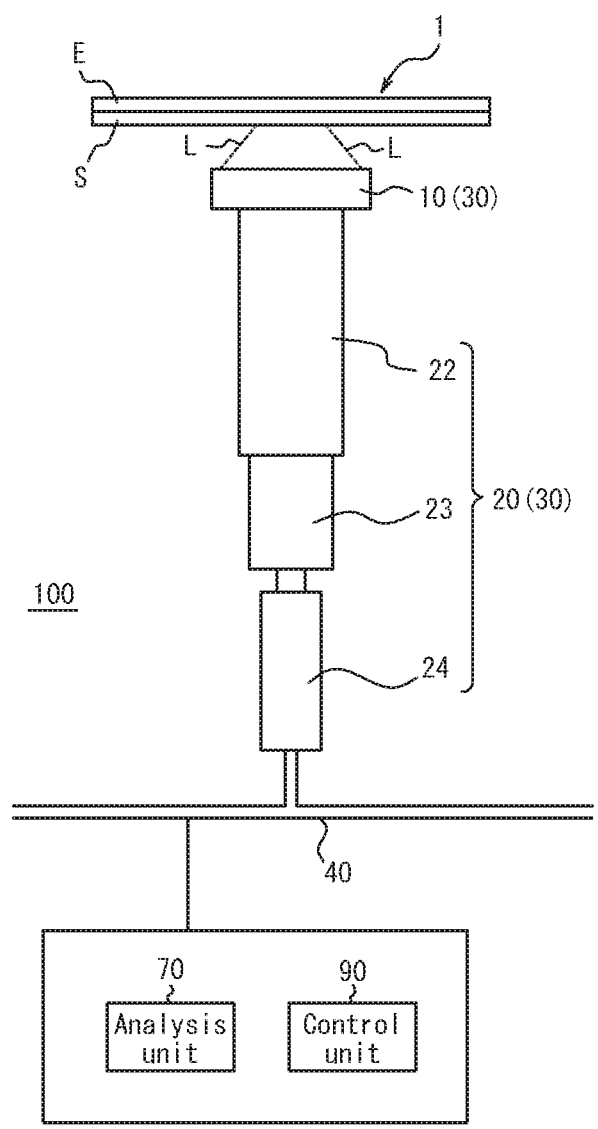
FIG. 6 is a schematic view illustrating an epitaxial wafer back surface inspection apparatus used in one embodiment of this disclosure.
Figure 7:
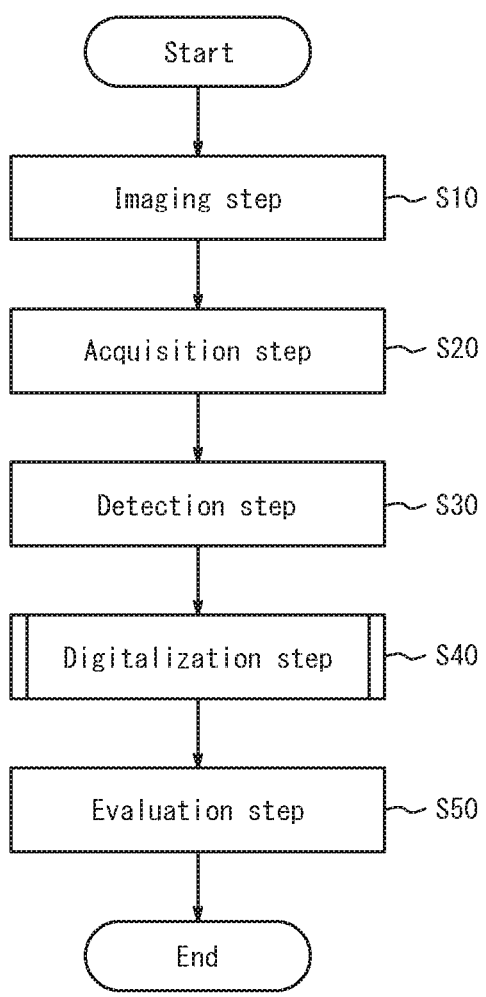
FIG. 7 is a flowchart illustrating a method of inspecting the back surface of an epitaxial wafer according to one embodiment of this disclosure.

Embodiments of this disclosure will now be described with reference to the drawings. FIG. 6 is a schematic view illustrating an epitaxial wafer back surface inspection apparatus 100 used in a method of inspecting the back surface of an epitaxial wafer according to one embodiment of this disclosure, and FIG. 7 is a flowchart illustrating a method of inspecting the back surface of an epitaxial wafer according to one embodiment of this disclosure. Like features in the embodiments are denoted by the same reference numerals, and the description of the features will not be repeated.

(Method of Inspecting Back Surface of Epitaxial Wafer)

As illustrated in FIGS. 6 and 7, the method of inspecting the back surface of an epitaxial wafer according to one embodiment of this disclosure inspects the back surface of the epitaxial wafer 1 using the epitaxial wafer back surface inspection apparatus 100 having an optical system 30 which is placed vertically with respect to the back surface of the epitaxial wafer 1 and includes an imaging unit 20 and an annular fiber optic illuminator 10 having either blue LEDs or red LEDs as a light source; and a scanning unit 40 that moves the optical system 30 in parallel with the back surface of the epitaxial wafer 1. The epitaxial wafer back surface inspection apparatus 100 according to one embodiment of this disclosure further has an analysis unit 70 and a control unit 90. The analysis unit 70 and the control unit 90 will be particularly described after describing embodiments of the method of inspecting the back surface of an epitaxial wafer.

As illustrated in the flowchart of FIG. 7, the method of inspecting the back surface of an epitaxial wafer, according to this embodiment includes an imaging step S10 of consecutively taking partial images of the back surface of the epitaxial wafer 1 while moving the optical system 30 using the scanning unit 40; an acquisition step S20 of acquiring a full image of the back surface of the epitaxial wafer 1 from the partial images; a detection step S30 of detecting, in the full image, pin mark defects constituted by a set of a plurality of point defects PM1, PM2, and PM3 present in the back surface of the silicon wafer 1; and a digitalization step S40 of digitalizing the individual point defects PM1, PM2, and PM3 to calculate the defect area of the individual point defects PM1, PM2, and PM3 of the detected pin mark defects. As described below, it is also preferred to perform an evaluation step S50 after the digitalization step S40.

Figure 8A:
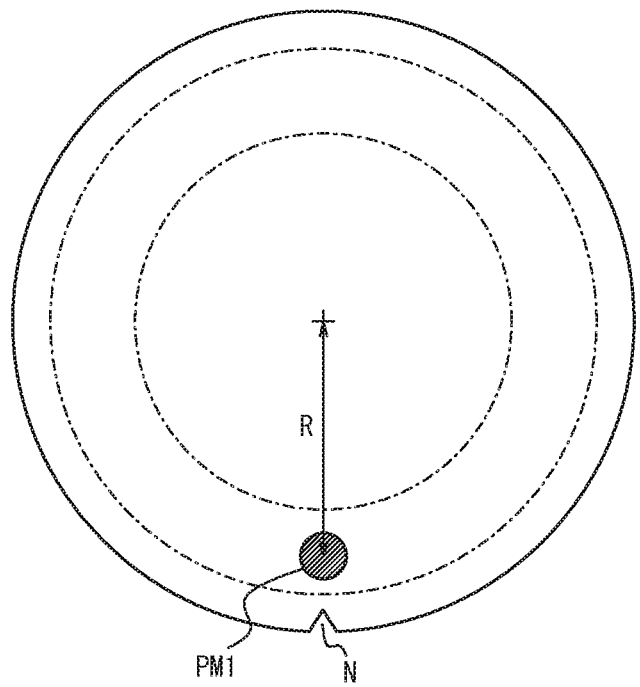
FIG. 8A is a schematic view illustrating pin marks that can be detected in one embodiment of this disclosure, which depicts a reference defect PM1 of the pin mark defects.
Figure 8B:
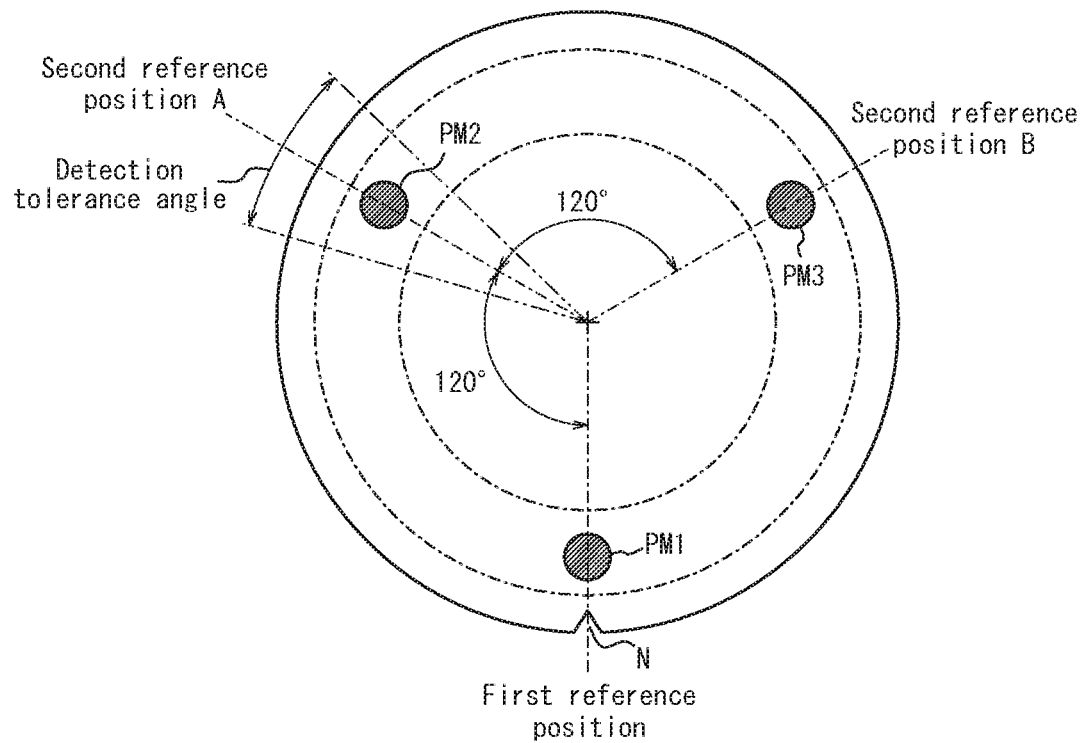
FIG. 8B is a schematic view illustrating pin marks that can be detected in one embodiment of this disclosure, which depicts a set of point defects PM1 to PM3 constituting pin mark defects.

The method of inspecting the back surface of an epitaxial wafer according to this embodiment detects, in the detection step S30, a point-like reference defect PM1 at a position at a certain distance from the center of the back surface of the epitaxial wafer 1 is abstracted, the position of the reference defect PM1 is defined as a first reference position (FIG. 8A), and the defects PM2, PM3 in the vicinity of a plurality of second reference positions found by rotating the first reference position PM1 at a regular angular interval about the center the plurality of times are abstracted, and the set of the point-like defects PM1, PM2, and PM3 in the vicinity of the first reference position and the plurality of second reference positions are detected as the pin mark defects (FIG. 8B). The detection step S30 will also be described in detail below with reference to FIG. 8A and FIG. 8B.

The features and the steps will be sequentially described in detail below with reference to FIGS. 6 and 7.

<Annular Fiber Optic Illuminator>

The annular fiber optic illuminator 10 used in the epitaxial wafer back surface inspection apparatus 100 may be a typical one as long as it has either blue LEDs or red LEDs as a light source. This is because, as described above, since the back surface of the epitaxial wafer 1 is rough compared with the surface of a PW, a light source which has relatively low illuminance and can be used stably is required to be used. As the light source of the annular fiber optic illuminator 10, for example, blue LEDs with a wavelength range of 450 nm to 500 nm or red LEDs with a wavelength range of 600 nm to 700 nm can be used. Note that the illuminance of irradiation light L emitted from the annular fiber optic illuminator 10 is preferably around 300,000 lux to 1,000,000 lux. The angle formed between the back surface of the epitaxial wafer 1 and the irradiation light L is a typical one; for example, the angle may be around 10° to 30°, or may be 20° or approximately 20° as in conventional techniques.

Figure 1A:
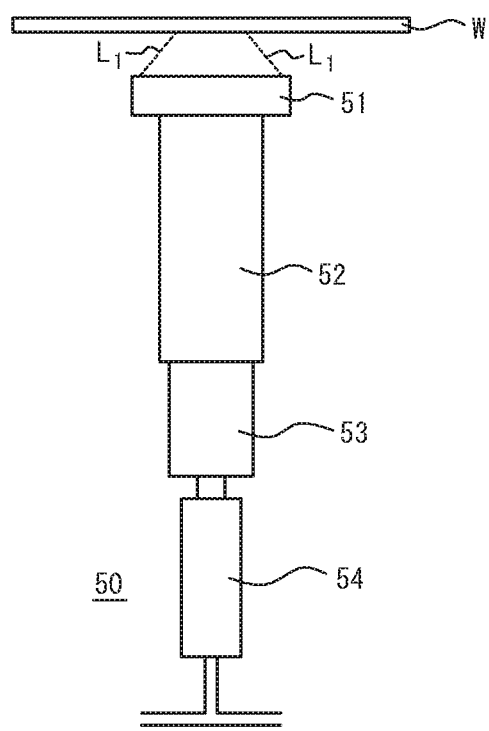
FIG. 1A is a schematic view illustrating a whole optical system of a wafer back surface inspection apparatus used in a conventional technique.
Figure 1B:
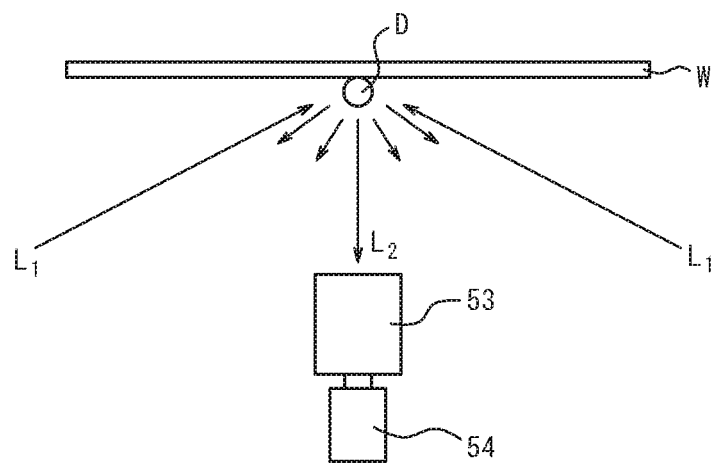
FIG. 1B is a schematic view illustrating incident light $L_1$ in the optical system of the wafer back surface inspection apparatus used in the conventional technique and scattered light $L_2$.
Figure 2:
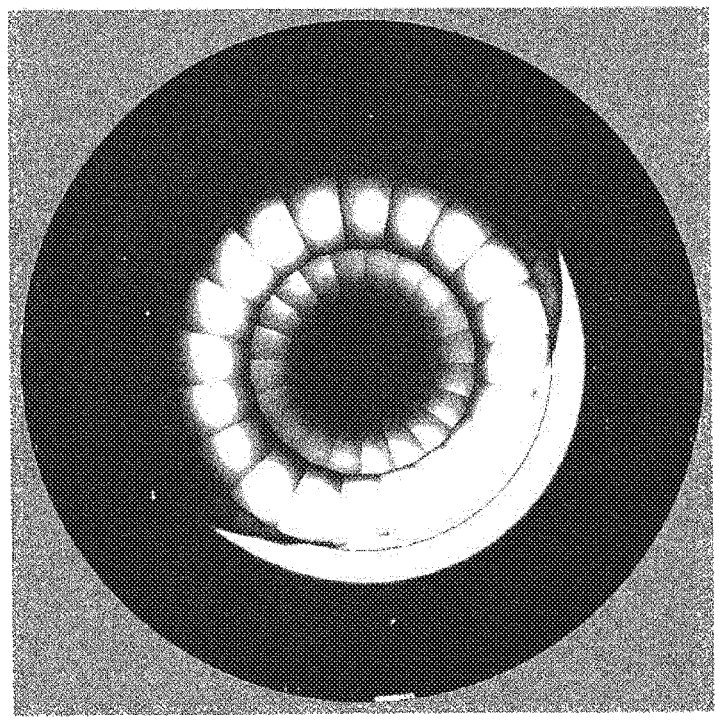
FIG. 2 is an example of a full image of the back surface of an epitaxial wafer, obtained using a conventional wafer inspection apparatus.

As described with reference to FIG. 2, when an extra high pressure mercury lamp (for example, illuminance: 5,000,000 lux) is used as the light source of the annular fiber optic illuminator 10 as in conventional techniques, the overflow of brightness due to defects occurs, so that defects in the back surface of the epitaxial wafer 1 cannot be fully identified.

<Imaging Unit>

The structure of the imaging unit 20 is not limited as long as an image can be taken by receiving scattered light from the back surface of the epitaxial wafer 1; for example, the imaging unit may include a lens barrel 22, a lens 23, and a light receiving unit 24. The lens barrel 22, the lens 23, and the light receiving unit 24 used may be ones typically used. A telecentric lens, for example, may be used as the lens 23, and a CCD camera, for example, may be used as the light receiving unit 24.

<Optical System>

The optical system 30 includes the above-mentioned annular fiber optic illuminator 10 and the imaging unit 20, irradiates the back surface of the epitaxial wafer 1 using the annular fiber optic illuminator 10, and takes partial images of the back surface of the epitaxial wafer 1 by receiving scattered light from the back surface.

<Scanning Unit>

The scanning unit 40 moves the optical system 30 in parallel with the back surface of the epitaxial wafer 1. The scanning unit 40 may move the optical system 30 in the circumferential direction of the epitaxial wafer 1 or may move it vertically or horizontally. Further, the epitaxial wafer back surface inspection apparatus 100 may have a plurality of (for example, three) optical systems 30, and the scanning unit 40 may move each optical system 30 in the circumferential direction. Note that the scanning unit 40 may include an arm connected to the optical system 30, and a drive stepper motor or a servomotor for actuating the arm, and others <Imaging Step>

In the method of inspecting the back surface of an epitaxial wafer according to this embodiment, the imaging step S10 is performed first as illustrated in FIG. 7. In the imaging step S10, a partial image of the back surface of the epitaxial wafer 1 is taken when the optical system 30 is placed at a certain position. Subsequently, the optical system 30 is moved to another position from the certain position mentioned above by the scanning unit 40 and another partial image of the back surface of the epitaxial wafer 1 is taken. For example, the back surface of the epitaxial wafer 1 is segmented to 100 to 200 segments, and the image taking and the scanning as described above are repeated for each segment, thus the partial images of the back surface of the epitaxial wafer 1 are consecutively taken (S10).

<Acquisition Step>

Figure 5A:
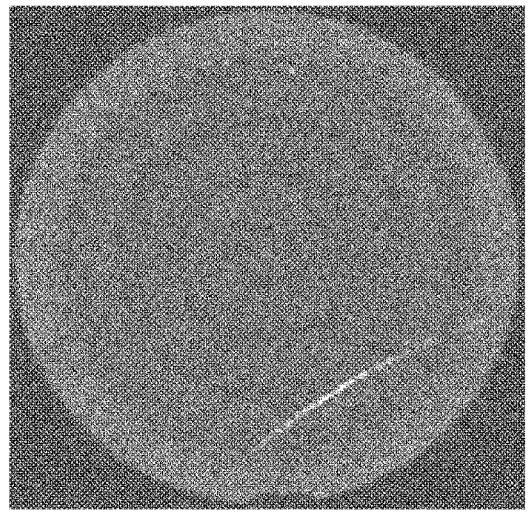
FIG. 5A is an example of a full image of the back surface of an epitaxial wafer obtained according to one embodiment of this disclosure.

Next, the acquisition step S20 is performed. In the acquisition step S20, the partial images taken in the imaging step S10 are composed to acquire the full image of the back surface of the epitaxial wafer 1 (S20). FIG. 5A mentioned above illustrates an example of a resultant full image.

<Detection Step>

After the acquisition step S20, the detection step S30 of detecting pin mark defects is performed.

Figure 3:
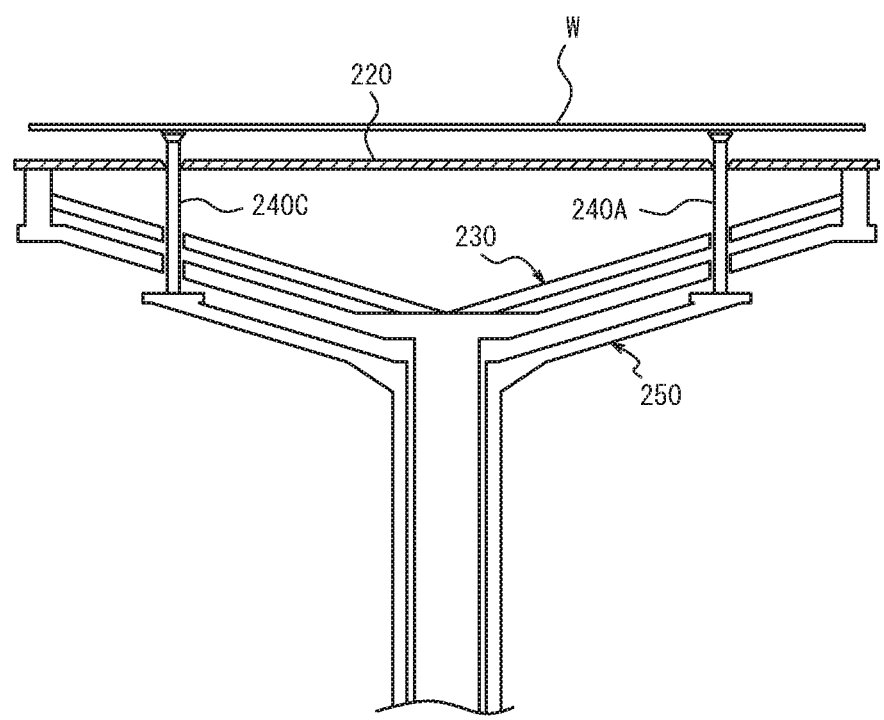
FIG. 3 is a schematic cross-sectional view illustrating a typical epitaxial growth apparatus.
Figure 4:
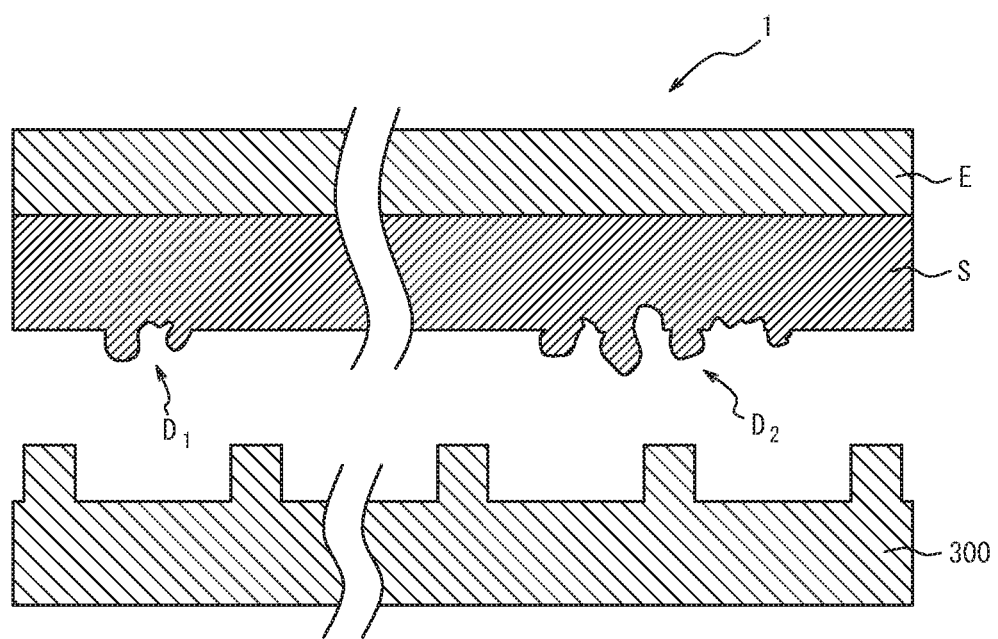
FIG. 4 is a schematic cross-sectional view of an epitaxial wafer being subjected to a typical device formation process.

The pin mark defects are specifically described. As described above, pin mark defects are defects caused depending on the shape of lift pins of an epitaxial growth apparatus or the contact state between the lift pins and a wafer, which defects are a set of circular point defects made up of groups of minute flaws such as traces of wear or deposits that are formed in the circumferential part of the back surface of an epitaxial wafer, typical of a lift-pin type epitaxial growth apparatus. Accordingly, in the case of a typical epitaxial growth apparatus as in FIG. 3, since three lift pins are formed, three point defects are formed at angular intervals of 120° about the center of the back surface of the epitaxial wafer, and the set of those point defects constitutes pin mark defects. Note that depending on the shape of the lift pins, the respective point defects of the pin mark defects are present in a range within a predetermined radius, and the point defects constitute circular light point defects. Further, the area of the respective point defects of the pin mark defects is roughly 0.2 mm$^2$ to 3 mm$^2$. An examples of pin mark defects is illustrated in the full image of FIG. 5A mentioned above. In the examples of FIG. 3, FIG. 8A, and FIG. 8B, schematic illustration is given assuming that the total number of the lift pins is three, which is a typical number; however, when the number of lift pins is N (where N is a natural number), the pin mark defects are made up of a set of N point defects.

The detection step S30 in this embodiment will be described in more detail with reference to FIG. 8A and FIG. 8B. In the detection step S30, the point-like reference defect PM1 at a position at a predetermined distance R from the center of the back surface of the epitaxial wafer is abstracted first (FIG. 8A). In detecting the reference defect PM1, a point-like defect having the maximum size of the defects at positions at a predetermined distance R from the center may be handled as the reference defect PM1. Alternatively, when a notch position N of the wafer is determined as a reference point, the allowable detection range of the point defect serving as the reference defect PM1 is determined by the arrangement of the lift pins, and the maximum point defect in the allowable detection range may be detected as the reference defect PM1.

Next, the position of the reference defect PM1 is defined as a first reference position, and defects in the vicinity of a plurality of second reference positions A and B found by rotating the first reference position by a regular angular interval about the center of the back surface of the epitaxial wafer 1 twice are abstracted. For example, in the example of FIG. 8, pin marks are formed at three positions, so that the positions found by rotating the first reference position by 120° twice are the second reference positions. Further, when the number of the lift pins is N, the first reference position is rotated by [360/N]° N times. Note that the positions where the pin marks are formed would be slightly displaced from the regular angular intervals, a detection tolerance angle of approximately ±5° may be set (FIG. 8B). In this case, being within the range of the detection tolerance angle means to be in the "vicinity". The set of the point defects PM1 to PM3 in the vicinity of the first reference position and the second reference positions A, B in FIG. 8B are detected as "the pin mark defects".

<Digitalization Step>

Figure 9:
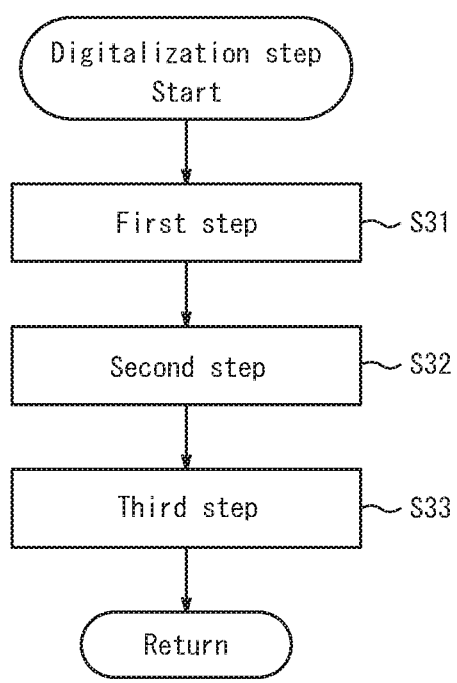
FIG. 9 is a flowchart illustrating a preferred embodiment of a digitalization step in a method of inspecting the back surface of an epitaxial wafer according to this disclosure.

After the detection step S30, the digitalization step S40 of calculating the defect area of each of the point defects PM1 to PM3 is performed. The digitalization of the defect area can be performed by various types of methods; for example, the digitalization is preferably performed according to a preferred embodiment including a first step S31, a second step S32, and a third step S33 depicted in the flow chart of FIG. 9.

<<First Step>>

Figure 10A:
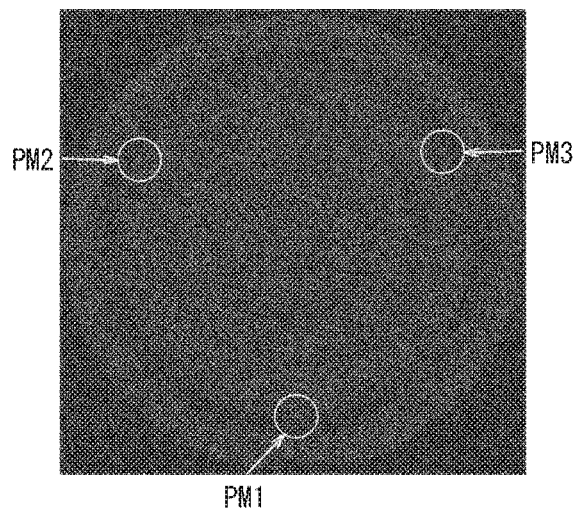
FIG. 10A illustrates a set of point defects PM1 to PM3 constituting pin mark defects detected according to this disclosure.
Figure 10B:
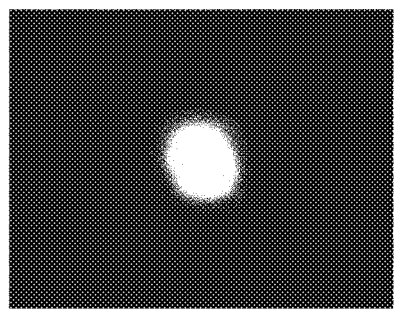
FIG. 10B is an enlarged image of the defect PM3 of the set of the point defects PM1 to PM3 in FIG. 10A.

First, the first step S31 of acquiring the luminance value of the pixels corresponding to the point defects PM1, PM2, and PM3 of the pin mark defects in the full image is preferably performed. Specifically, in this first step, the luminance data of the point defects PM1, PM2, and PM3 are read from the full image on a pixel basis. FIG. 10A illustrates a specific example of the full image. FIG. 10A further illustrates the positions of the respective point defects PM1, PM2, PM3 of the pin mark defects. FIG. 10B is an enlarged view of the point defect PM3 in FIG. 10A.

<<Second Step>>

Figure 10C:
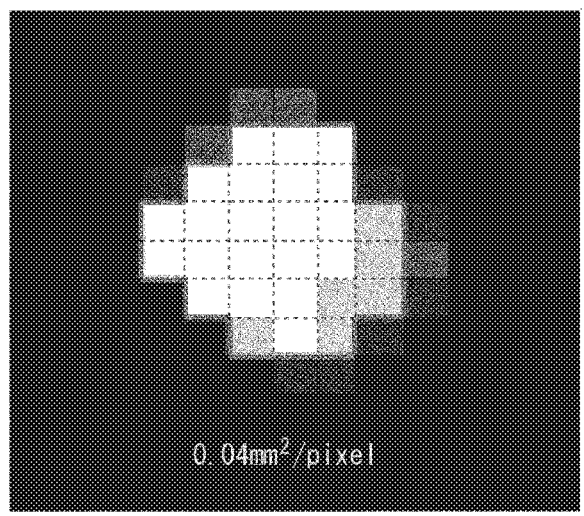
FIG. 10C illustrates the defect PM3 in FIG. 10B, expressed in binary.

After performing the first step S31, the second step S32 of converting the luminance value of each pixel corresponding to the point defects PM1, PM2, and PM3 to binary based on a predetermined luminance threshold is preferably performed. This is to define the outer edge of the defects to calculate the area in the subsequent third step S33. FIG. 10C illustrates the image of the point defect in FIG. 10B, expressed in binary is depicted on a pixel basis. In this example, one pixel corresponds to 0.04 $mm^2$.

<<Third Step>>

In the third step S33, the defect area of the point defects PM1, PM2, and PM3 is preferably calculated based on the binary data of each pixel. In calculating the defect area, for example, the number of pixels having a luminance exceeding the luminance threshold may be counted; alternatively, the defect area may be calculated by excluding the pixels having a luminance equal to or less than the luminance threshold from the detection region of the point defects. In the example of FIG. 10C, the number of the pixels having a luminance exceeding the luminance threshold is 27, thus the defect area of the point defect PM3 can be calculated as 0.04 ($mm^2$/pixel)×27 (pixels)=1.08 $mm^2$. Such calculation of the defect area can be performed in the like manner on the point defects other than the point defect PM3.

As described above, pin mark defects in the back surface of the epitaxial wafer can be detected, and the defect size of the individual point defects of the pin mark defects can be quantitatively evaluated, by performing the method of inspecting the back surface of an epitaxial wafer according to this embodiment.

<Evaluation Step>

Here, as described above, pin mark defects are conventionally regarded as defects that are negligible even if formed considering the mechanism of the formation; however, pin mark defects would have a detrimental effect in the device formation process depending on the defect size of individual point defects of the pin mark defects. This being the case, the method of inspecting the back surface of an epitaxial wafer according to this embodiment preferably further includes an evaluation step of determining whether the individual point defects PM1, PM2, and PM3 are acceptable based on the comparison between the defect area of the individual point defects PM1, PM2, and PM3 and the predetermined area threshold, after the digitalization step S40. Thus, whether the point defects PM1, PM2, and PM3 of the pin mark defects are acceptable or not can be determined one by one, so that the quality of the product wafer to be obtained can be ensured. Note that the above area threshold may be set to a desired value depending on the specifications of the product wafer.

Figure 5B:
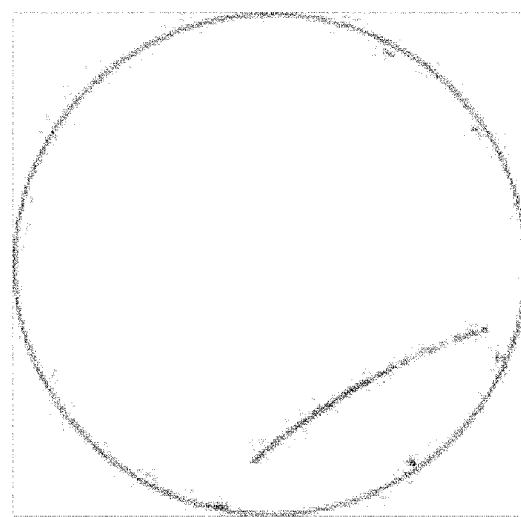
FIG. 5B is a full image of the back surface of the epitaxial wafer obtained by performing image processing on FIG. 5A.

In the method of inspecting the back surface of an epitaxial wafer according to this embodiment, an image processing step of performing image processing on the acquired full image is also preferably performed prior to the detection step S30. It is also preferred to detect defects other than pin marks based on the full image subjected to image processing. In the image processing step, for example, when a differentiated image is obtained from the full image, for example, the influence of noise that may be included in the partial images taken can be reduced, and defects present in the back surface of the epitaxial wafer 1 can be detected more accurately. FIG. 5B mentioned above is an image obtained by performing differentiation and skeletonization on the full image of FIG. 5A.

Further, the epitaxial wafer 1 inspected by the method of inspecting the back surface of an epitaxial silicon wafer according to one embodiment of this disclosure may be an epitaxial silicon wafer obtained by epitaxially growing a silicon epitaxial layer on the surface of a mirror-polished silicon wafer.

(Epitaxial Wafer Back Surface Inspection Apparatus)

As schematically illustrated in FIG. 6, the epitaxial wafer back surface inspection apparatus 100 according to one embodiment of this disclosure is an inspection apparatus by which the above-described method of inspecting the backs surface of an epitaxial wafer is performed. This epitaxial wafer back surface inspection apparatus 100 includes an optical system 30 which includes an imaging unit 20 and an annular fiber optic illuminator 10 having either blue LEDs or red LEDs as a light source; a scanning unit 40 that moves the optical system 30 in parallel with the back surface of the epitaxial wafer 1; an analysis unit 70 for analyzing an image of the back surface of the epitaxial wafer 1, acquired by the optical system 30; and a control unit 90 for controlling the optical system 30, the scanning unit 40, and the analysis unit 70.

Using the above control unit 90 for controlling the optical system 30, the scanning unit 40, and the analysis unit 70; the epitaxial wafer back surface inspection apparatus 100 performs the imaging step S10, the acquisition step S20, the detection step S30, the digitalization step S40, and optionally the evaluation step S50. Specifically, the optical system 30 consecutively takes partial images of the back surface of the epitaxial wafer 1 while being moved by the scanning unit 40 using the control unit 90. Further, the analysis unit 70 acquires a full image of the back surface from the partial images using the control unit 90, and pin mark defects constituted by a plurality of point defects PM1, PM2, and PM3 present in the back surface of the epitaxial wafer 1 are detected in the full image. Further, the analysis unit 70 performs digitalization on the individual point defects PM1, PM2, and PM3 of the detected pin mark defects, thereby calculating the defect area of the individual point defects PM1, PM2, and PM3. Here, when the analysis unit 70 detects the pin mark defects, a point-like reference defect PM1 at a certain distance from the center of the back surface of the epitaxial wafer 1 is abstracted, and the position of the reference defect defined as a first reference position, and defects PM2 and PM3 in the vicinity of a plurality of second reference positions found by rotating the first reference position by a regular angular interval about the center the plurality of times are abstracted, and a set of the point-like defects in the vicinity of the first reference position and the plurality of the second reference positions are detected as the pin mark defects. Note that in FIG. 6, only one optical system 30 is depicted; however, a plurality of optical systems may be provided in the back surface of the epitaxial wafer 1.

Preferably, in performing the digitalization described above, the analysis unit 70 acquires the luminance value of each pixel corresponding to the point defects PM1, PM2, and PM3 of the pin mark defects in the full image using the control unit 90, converts the luminance value of each pixel to binary based on the predetermined luminance threshold value, and calculates the defect area of the individual point defects PM1, PM2, and PM3 based on the binary data of each pixel. Further, the analysis unit 70 preferably also determines whether the individual point defects PM1, PM2, and PM3 are acceptable based on the comparison between the defect area of the individual point defects PM1, PM2, and PM3 and the predetermined area threshold using the control unit 90.

The analysis unit 70 and the control unit 90 may be implemented by a suitable processor such as a central processing unit (CPU) or an MPU, and may have a storage unit such as a memory or a hard disk. Further, the analysis unit 70 and the control unit 90 control the transmittance of information and instructions between the components of the epitaxial wafer back surface inspection apparatus 100 and the operation of each unit by executing programs for performing the above method of inspecting the back surface of an epitaxial wafer previously stored in the analysis unit 70 and the control unit 90.

(Method of Managing Lift Pin of Epitaxial Growth Apparatus)

The inventors further found a method of properly managing lift pins of an epitaxial growth apparatus using the defect area of the individual point defects, calculated by the above method of inspecting the back surface of an epitaxial wafer. Specifically, in an embodiment involving the method of managing lift pins of an epitaxial growth apparatus, the replacement period for the lift pins of the epitaxial growth apparatus is determined based on the defect area of the individual point defects PM1, PM2, and PM3.

Figure 11:
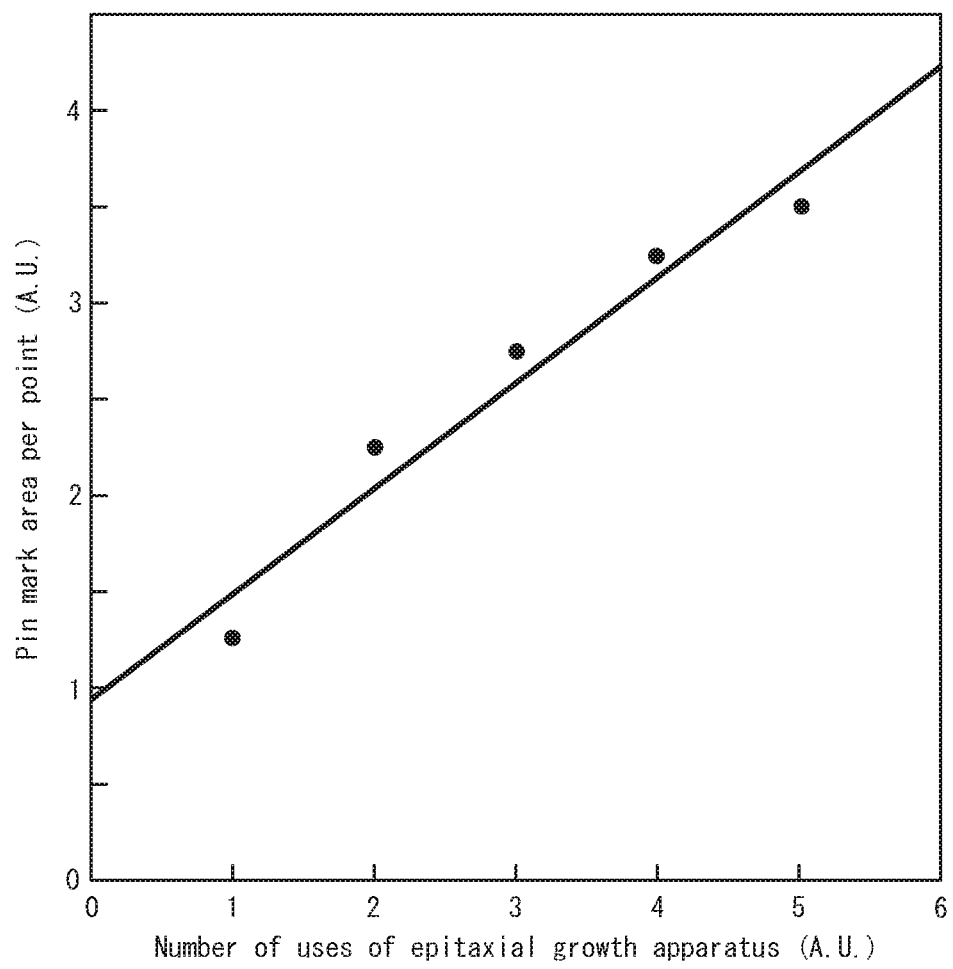
FIG. 11 is a graph illustrating the correlation between the number of uses of an epitaxial growth apparatus and the defect area of pin marks.

According to the studies made by the inventors, as illustrated in FIG. 11, as the number of uses of the epitaxial growth apparatus is increased, the area of the individual point defects of pin mark defects was found to be increased. This is presumably because portions of the back surface of the epitaxial wafer that are in contact with the lift pins gradually wear, which increases the contact area.

Here, since not all the plurality of lift pins are evenly in contact with the back surface of the epitaxial wafer, the defect area of some point defects of the individual point defects of the pin mark defects is inferred to be rapidly increased compared with the defect area of the other point defects. Further, some trouble would rapidly increase the defect area of some of the point defects. As described above, in order to ensure the quality of a product wafer, the defect area of each of the individual point defects of the pin mark defects is desirably equal to or less than a predetermined area.

To this end, with the use of the above method of managing lift pins, the defect area of each of the point defects PM1, PM2, and PM3 can be calculated, and whether one or all of the lift pins must be replaced can be determined depending on whether the defect area exceeds a predetermined threshold.

(Method of Producing Epitaxial Wafer)

When an epitaxial wafer is produced by a production process including the above embodiment of the method of inspecting the back surface of an epitaxial wafer, each of the point defects PM1, PM2, and PM3 of the pin mark defects is quantitatively evaluated, thus an epitaxial wafer with ensured quality for a product wafer can be produced. Specifically, the method of producing an epitaxial wafer according to this embodiment includes an epitaxial layer formation step of forming an epitaxial layer on the surface of a silicon wafer to obtain an epitaxial wafer 1 using a lift-pin type epitaxial growth apparatus; and a back surface inspection step of inspecting the back surface of the epitaxial wafer 1. Note that for the back surface inspection step described below, the description of the details that overlap those of the above method of inspecting the back surface will not be repeated.

Here, using the epitaxial wafer back surface inspection apparatus 100 having the optical system 30 which is placed vertically with respect to the back surface of the epitaxial wafer 1 and includes an imaging unit 20 and an annular fiber optic illuminator 10 having either blue LEDs or red LEDs as a light source, and a scanning unit 40 that moves the optical system 30 in parallel with the back surface of the epitaxial wafer 1, the back surface inspection step of this embodiment includes: (a) an imaging step of consecutively taking partial images of the back surface of the epitaxial wafer 1 while moving the optical system 30 using the scanning unit 40; (b) an acquisition step of acquiring a full image of the back surface of the epitaxial wafer 1 from the partial images; (c) a detection step of detecting, in the full image, pin mark defects constituted by a set of a plurality of point defects present in the back surface of the epitaxial wafer 1; (d) a digitalization step of digitalizing the individual point defects of the detected pin mark defects to calculate the defect area of the individual point defects; and (e) an evaluation step of determining whether the individual point defects are acceptable based on the comparison between the defect area of the individual point defects and the predetermined area threshold, after the digitalization step.

In this embodiment, in the detection step (c), a point-like reference defect at a position at a certain distance from a center of the back surface of the epitaxial wafer 1 is abstracted, the position of the reference defect is defined as a first reference position, defects in the vicinity of a plurality of second reference positions found by rotating the first reference position by a regular angular interval about the center the plurality of times are abstracted, and the set of the point-like defects in the vicinity of the first reference position and the plurality of the second reference positions are detected as the pin mark defects.

Further, in the epitaxial layer formation step, the epitaxial layer can be formed on the surface of a silicon wafer using a typical lift-pin type epitaxial growth apparatus. For example, as the growth conditions for growing a silicon epitaxial layer, a source gas such as dichlorosilane or trichlorosilane can be introduced into a chamber in the epitaxial growth apparatus using hydrogen as a carrier gas, so that an epitaxial layer can be grown on the silicon wafer by CVD at a temperature in the range of approximately 1000° C. to 1200° C., although the growth temperature depends also on the source gas to be used. Further, the thickness of the epitaxial layer is preferably in the range of 1 μm to 15 μm.

Thus, an epitaxial wafer with ensured quality for a product wafer can be produced by the back surface inspection step of this embodiment.

Here, in the embodiment of the above production method, the digitalization step (d) preferably includes: a first step of acquiring the luminance value of each pixel corresponding to the individual point defects of the pin mark defects in the full image; a second step of converting the luminance value of each pixel to binary based on a predetermined luminance threshold; and a third step of calculating the defect area of the individual point defects based on the binary data of each pixel.

Note that after the epitaxial layer formation step, one of or both of the front surface and the back surface of the epitaxial wafer 1 may of course be subjected to polishing and cleaning, for example.

Although the embodiments of this disclosure have been described above, the embodiments are illustrated only as representative embodiments, and therefore this disclosure is not limited thereto and may be changed in various ways within the spirit of this disclosure.

Examples

A silicon epitaxial layer was formed on the surface of a silicon wafer using a lift pin-type epitaxial growth apparatus. The defect area of pin mark defects in the back surface of the formed epitaxial wafer was evaluated.

(Pin Mark Defect Area Evaluation Using Conventional Technique)

Figure 12A:
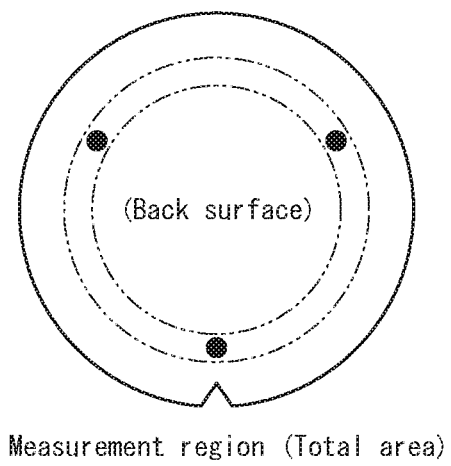
FIG. 12A is a schematic view illustrating measurement points for the defect area of pin mark defects according to a conventional technique in Examples.

The defect area of the pin mark defects in the back surface of the epitaxial wafer was measured using a conventional particle inspection system (SP2 manufactured by KLA-Tencor Corporation). Since a wafer is irradiated with laser uniformly in the circumferential direction by the conventional particle inspection system, the defect area of the pin mark defects was measured as the total defect area of a whole ring-shaped region including the pin mark defects as illustrated in FIG. 12A. Note that in order to determine the ring-shaped region including the pin mark defects as a detection range, the distance of each pin mark defect observed in the entire back surface of the wafer from the center of the wafer was previously ascertained by appearance observation by visual observation. Accordingly, other defects in the measurement region depicted in FIG. 12A could be included in the defect area.

(Pin Mark Defect Area Evaluation According to this Disclosure)

Figure 12B:
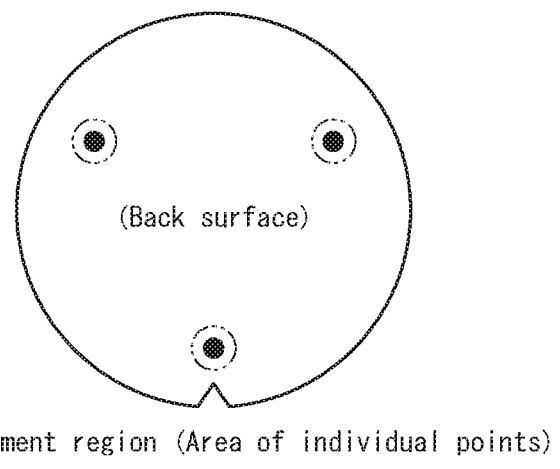
FIG. 12B is a schematic view illustrating measurement points for the defect area of pin mark defects according to this disclosure in Examples.

The defect area of the pin mark defects in the back surface of epitaxial wafers was measured using the above-described epitaxial wafer back surface inspection apparatus 100 according to this disclosure. Using the epitaxial wafer back surface inspection apparatus 100, the defect area of each of the point defects of the pin mark defects can be measured individually as illustrated in FIG. 12B.

Figure 13A:
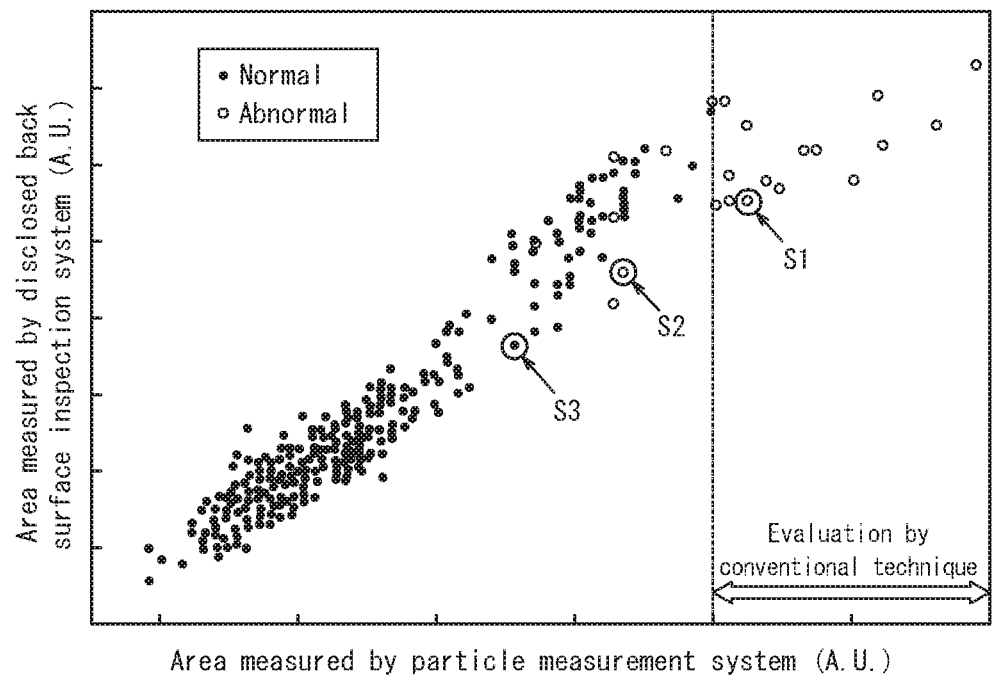
FIG. 13A is a graph illustrating the comparison between the measurement results of the defect area of pin mark defects according to a conventional technique and this disclosure in Examples.
Figure 13B:
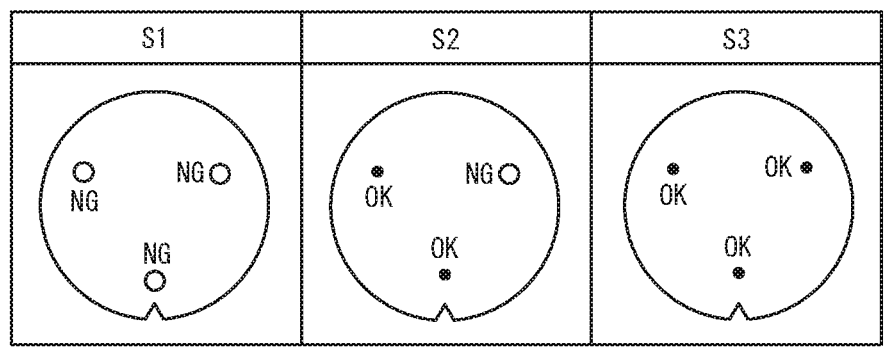
FIG. 13B is a schematic view illustrating the respective evaluation results of samples S1 to S3 in FIG. 13A.

FIG. 13A presents a graph depicting the correlation between the total defect area of the region including the pin mark defects, measured using the conventional particle inspection system and the total defect area measured using the epitaxial wafer back surface inspection apparatus 100 according to this disclosure. The evaluation results of each point defect in samples S1, S2, and S3 are given in FIG. 13B.

When the conventional particle measurement system is used, the defect area is the total defect area of all the point defects of the pin mark defects. Therefore, when the pin mark defects are evaluated using the conventional particle measurement system, all the defects having a defect area exceeding the threshold are determined as unacceptable as illustrated in FIG. 13A. However, although pin mark defects are determined as acceptable by the conventional technique, they may include defects erroneously determined as acceptable by the conventional technique as illustrated in FIG. 13A. This is because even when the defect area of one of the pin mark defects is large as in the sample S2, the defect area of the other two point defects is small, and the total defect area is sufficiently small according to the conventional technique, thus such a wafer is inevitably determined as a non-defective product. By contrast, according to this disclosure, each of the point defects of the pin mark defects can be quantitatively evaluated, thus a wafer having even one point defect determined as unacceptable can be determined as a defective product regardless of whether the other point defects are acceptable or not. Consequently, the pin mark defects can be evaluated more accurately by the disclosed method.

INDUSTRIAL APPLICABILITY

This disclosure provides a method of inspecting the back surface of an epitaxial wafer, which is capable of detecting pin mark defects in the back surface of the epitaxial wafer and quantitatively evaluating the pin mark defects.

REFERENCE SIGNS LIST

1 Epitaxial wafer
10 Annular fiber optic illuminator
20 Imaging unit
30 Optical system
40 Scanning unit
70 Analysis unit
90 Control unit
100 Epitaxial wafer back surface inspection apparatus
D Defect

The invention claimed is:

1. A method of inspecting a back surface of an epitaxial wafer using an epitaxial wafer back surface inspection apparatus having an optical system which is placed vertically with respect to the back surface of the epitaxial wafer and includes an imaging unit and an annular fiber optic illuminator having either blue LEDs or red LEDs as a light source, and a scanning unit that moves the optical system in parallel with the back surface, comprising:

consecutively taking partial images of the back surface while moving the optical system using the scanning unit;

acquiring a full image of the back surface from the partial images;

detecting, in the full image, pin mark defects constituted by a set of a plurality of point defects present in the back surface; and digitalizing the individual point defects of the detected pin mark defects to calculate a defect area of the individual point defects, wherein during the detecting, a point-like reference defect at a position at a certain distance from a center of the back surface of the epitaxial wafer is abstracted, the position of the reference defect is defined as a first reference position, defects in the vicinity of a plurality of second reference positions found by rotating the first reference position by a regular angular interval about the center the plurality of times are abstracted, and the set of the point-like defects in the vicinity of the first reference position and the plurality of the second reference positions are detected as the pin mark defects.

2. The method of inspecting a back surface of an epitaxial wafer, according to claim 1, wherein the digitalizing comprises:

acquiring a luminance value of each pixel corresponding to the individual point defects of the pin mark defects in the full image;

converting the luminance value of each pixel to binary based on a predetermined luminance threshold; and calculating the defect area of the individual point defects based on the binary data of each pixel.

3. The method of inspecting a back surface of an epitaxial wafer, according to claim 2, further comprising determining whether the individual point defects are acceptable based on comparison between the defect area of the individual point defects and the predetermined area threshold, after the digitalizing.

4. A method of managing lift pins of an epitaxial growth apparatus, comprising determining a replacement period for the lift pins of an epitaxial growth apparatus based on the defect area of the individual point defects, calculated by the method of inspecting a back surface of an epitaxial wafer, according to claim 3.

5. A method of managing lift pins of an epitaxial growth apparatus, comprising determining a replacement period for the lift pins of an epitaxial growth apparatus based on the defect area of the individual point defects, calculated by the method of inspecting a back surface of an epitaxial wafer, according to claim 2.

6. The method of inspecting a back surface of an epitaxial wafer, according to claim 1, further comprising determining whether the individual point defects are acceptable based on comparison between the defect area of the individual point defects and the predetermined area threshold, after the digitalizing.

7. A method of managing lift pins of an epitaxial growth apparatus, comprising determining a replacement period for the lift pins of an epitaxial growth apparatus based on the defect area of the individual point defects, calculated by the method of inspecting a back surface of an epitaxial wafer, according to claim 6.

8. A method of managing lift pins of an epitaxial growth apparatus, comprising determining a replacement period for the lift pins of an epitaxial growth apparatus based on the defect area of the individual point defects, calculated by the method of inspecting a back surface of an epitaxial wafer, according to claim 1.

9. An epitaxial wafer back surface inspection apparatus comprising:

an optical system which is placed vertically with respect to the back surface of the epitaxial wafer and includes an imaging unit and an annular fiber optic illuminator having either blue LEDs or red LEDs as a light source;

a scanning unit configured to move the optical system in parallel with the back surface;

an analysis unit configured to analyze an image of the back surface of the epitaxial wafer, acquired by the optical system; and a control unit configured to control the optical system, the scanning unit, and the analysis unit, wherein the optical system is configured to consecutively take partial images of the back surface while being moved by the scanning unit using the control unit, the analysis unit is configured to acquire a full image of the back surface from the partial images using the control unit, to detect, in the full image, pin mark defects constituted by a set of a plurality of point defects present in the back surface, and to calculate the defect area of the individual point defects of the detected pin mark defects by digitalizing the individual point defects, and wherein when the pin mark defects are detected, the epitaxial wafer back surface inspection apparatus is configured to abstract a point-like reference defect at a position at a certain distance from a center of the back surface of the epitaxial wafer, to define the position of the reference defect as a first reference position, to abstract defects in the vicinity of a plurality of second reference positions found by rotating the first reference position by a regular angular interval about the center the plurality of times, and to detect the set of the point-like defects in the vicinity of the first reference position and the plurality of the second reference positions as the pin mark defects.

10. The epitaxial wafer back surface inspection apparatus according to claim 9, wherein in the digitalization, the analysis unit is configured to acquire a luminance value of each pixel corresponding to the individual point defects of the pin mark defects in the full image using the control unit, to convert the luminance value of each pixel to binary based on a predetermined luminance threshold, and to calculate the defect area of the individual point defects based on the binary data of each pixel.

11. The epitaxial wafer back surface inspection apparatus according to claim 10, wherein the analysis unit is configured to determine whether the individual point defects are acceptable using the control unit based on a comparison between the defect area of the individual point defects and the predetermined area threshold.

12. The epitaxial wafer back surface inspection apparatus according to claim 9, wherein the analysis unit is configured to determine whether the individual point defects are acceptable using the control unit based on a comparison between the defect area of the individual point defects and the predetermined area threshold.

13. A method of producing an epitaxial wafer, comprising:

forming an epitaxial layer on a surface of a silicon wafer to obtain an epitaxial wafer using a lift-pin type epitaxial growth apparatus; and inspecting a back surface of the epitaxial wafer, wherein using an epitaxial wafer back surface inspection apparatus having an optical system which is placed vertically with respect to the back surface of the epitaxial wafer and includes an imaging unit and an annular fiber optic illuminator having either blue LEDs or red LEDs as a light source, and a scanning unit that moves the optical system in parallel with the back surface, the inspecting comprises:
- (a) consecutively taking partial images of the back surface while moving the optical system using the scanning unit;
- (b) acquiring a full image of the back surface from the partial images;
- (c) detecting, in the full image, pin mark defects constituted by a set of a plurality of point defects present in the back surface;
- (d) digitalizing the individual point defects of the detected pin mark defects to calculate a defect area of the individual point defects; and
- (e) determining whether the individual point defects are acceptable based on comparison between the defect area of the individual point defects and the predetermined area threshold, after the digitalizing, wherein during the detecting (c), a point-like reference defect at a position at a certain distance from a center of the back surface of the epitaxial wafer is abstracted, the position of the reference defect is defined as a first reference position, defects in the vicinity of a plurality of second reference positions found by rotating the first reference position by a regular angular interval about the center the plurality of times are abstracted, and the set of the point-like defects in the vicinity of the first reference position and the plurality of the second reference positions are detected as the pin mark defects.

14. The method of producing an epitaxial wafer, according to claim 13, wherein the digitalizing (d) comprises:
- acquiring a luminance value of each pixel corresponding to the individual point defects of the pin mark defects in the full image;
- converting the luminance value of each pixel to binary based on a predetermined luminance threshold;
- calculating the defect area of the individual point defects based on the binary data of each pixel.

* * * * *